US00RE36874E

United States Patent [19]

Chen

[11] E Patent Number: Re. 36,874

[45] **Reissued Date of Patent: *Sep. 19, 2000**

[54] SUPPLY VOLTAGE TOLERANT PHASE-LOCKED LOOP CIRCUIT

[75] Inventor: Dao-Long Chen, Ft. Collins, Colo.

[73] Assignee: Hyundai Electronics America, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/725,913

[22] Filed: Oct. 4, 1996

Related U.S. Patent Documents

Reissue of:

[64] Patent No.: 5,463,352
Issued: Oct. 31, 1995
Appl. No.: 08/311,469
Filed: Sep. 23, 1994

[51] Int. Cl.[7] ..... H03L 1/00

[52] U.S. Cl. ..... 331/1 R; 331/8; 331/11; 331/16; 331/17; 331/25

[58] Field of Search ..... 331/1 R, 8, 10, 331/11, 16, 17, 25, 185, 186

[56] References Cited

U.S. PATENT DOCUMENTS 5,061,907 10/1991 Rasmussen ..... 331/57
5,175,512 12/1992 Self ..... 331/57
5,258,725 11/1993 Kinoshita ..... 331/17
5,302,920 4/1994 Bitting ..... 331/45
5,331,295 7/1994 Jelinek et al. ..... 331/57

FOREIGN PATENT DOCUMENTS 93-335840 12/1993 Japan .

OTHER PUBLICATIONS

Ware et al.; "A 200–Mhz CMOS Phase–Locked Loop With Dual Phase Detectors"; Dec. 1989; pp.1560–1568, IEEE Journal of Solid–State Circuits, vol. 24, No. 6.

Jeong et al.; "Design of PLL–Based Clock Generation Circuits"; IEEE Journal of Solid–State Circuits, vol. SC–22, No. 2, Apr. 1987, pp. 255–261.

*Primary Examiner*—Siegfried H. Grimm
*Attorney, Agent, or Firm*—Townsend and Townsend and Crew

[57] ABSTRACT

A phase-locked loop design is provide that can operate at a plurality of dissimilar supply voltages. By adjusting the frequency range of a PLL based on the power supply voltage, the same PLL design can operate at different supply voltages.

4 Claims, 7 Drawing Sheets

SUPPLY VOLTAGE TOLERANT PHASE-LOCKED LOOP CIRCUIT

Matter enclosed in heavy brackets [ ] appears in the original patent but forms no part of this reissue specification; matter printed in italics indicates the additions made by reissue.

TECHNICAL FIELD

The present invention relates to integrated circuit devices, and more particularly to a phase-locked loop integrated circuit.

BACKGROUND OF THE INVENTION

Until recently, most of the integrated circuits were designed to operate with a single 5 V power supply voltage. But with the advent of portable PCs and energy efficient "green" PCs, many integrated circuits now have to be able to operate at both 3.3 V and 5 V. It is usually not a problem for digital circuits as long as the circuits can operate at the required clock frequency at 3.3 V. But for analog circuits, operating at a different supply voltage can be a complicated issue, especially for the analog phase-locked loops (PLL). For example, the frequency range of a PLL usually has a strong dependency on the power supply voltage. FIG. 1 shows a typical PLL circuit known in the art. As shown in FIG. 2A–2B, a PLL designed for 3.3 V operation can be too fast for 5 V operation, especially if variations in temperature and process conditions are also taken into account. Similarly, a PLL designed to operate at 5 V can be too slow if operated at 3.3 V.

It is an object of the present invention to provide a method for adjusting the frequency range of a PLL based on supply voltage so that the same PLL design can operate at different supply voltages.

It is yet another object of the present invention to provide PLL that can operate at both 3.3 V and 5 V.

SUMMARY OF THE INVENTION

A phase-locked loop design is provided that can operate at a plurality of dissimilar supply voltages. By adjusting the frequency range of a PLL based on the power supply voltage, the same PLL design can operate at different supply voltages.

DETAILED DESCRIPTION OF THE PREFERRED EMBODIMENT

Figure 1:
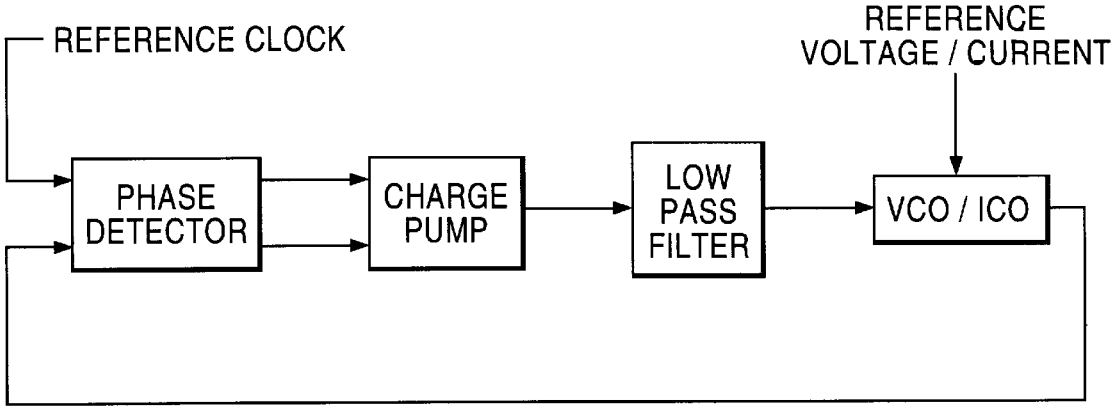
PRIOR ART FIG. 1
FIG. 1 shows a traditional phase-locked loop circuit
Figure 3:
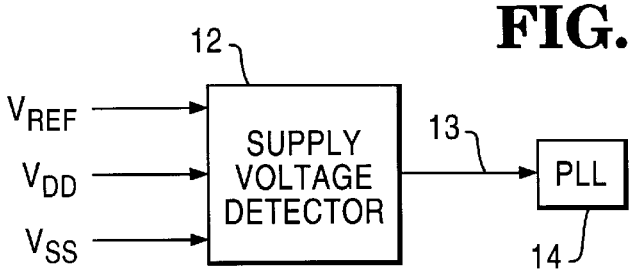
FIG. 3 is a block diagram of an improved phase-locked loop.
Figure 4:
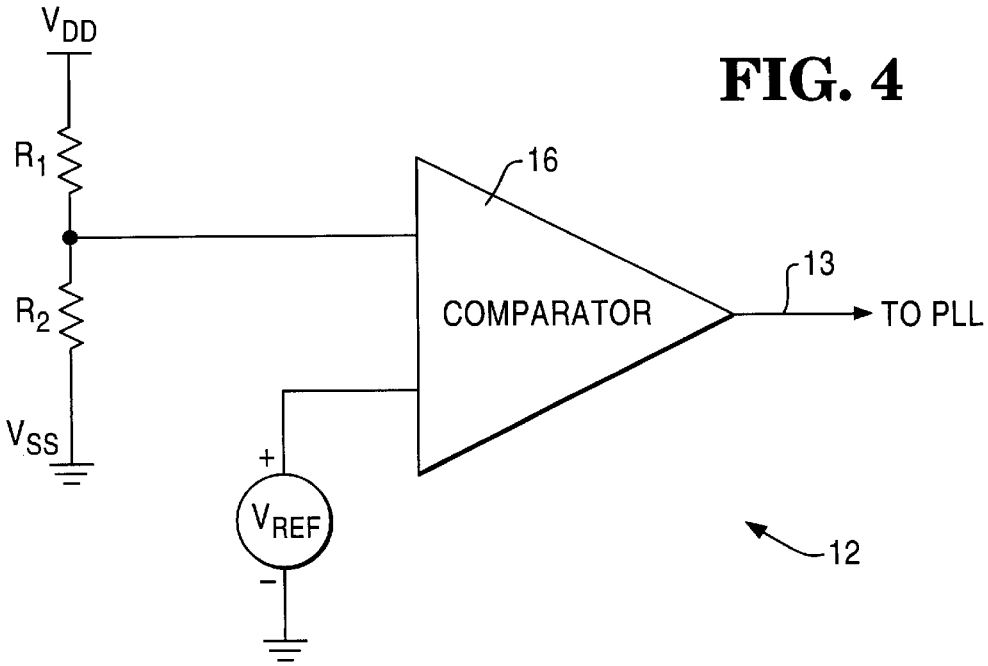
FIG. 4 is a schematic of a supply voltage detector circuit.
Figure 2A:
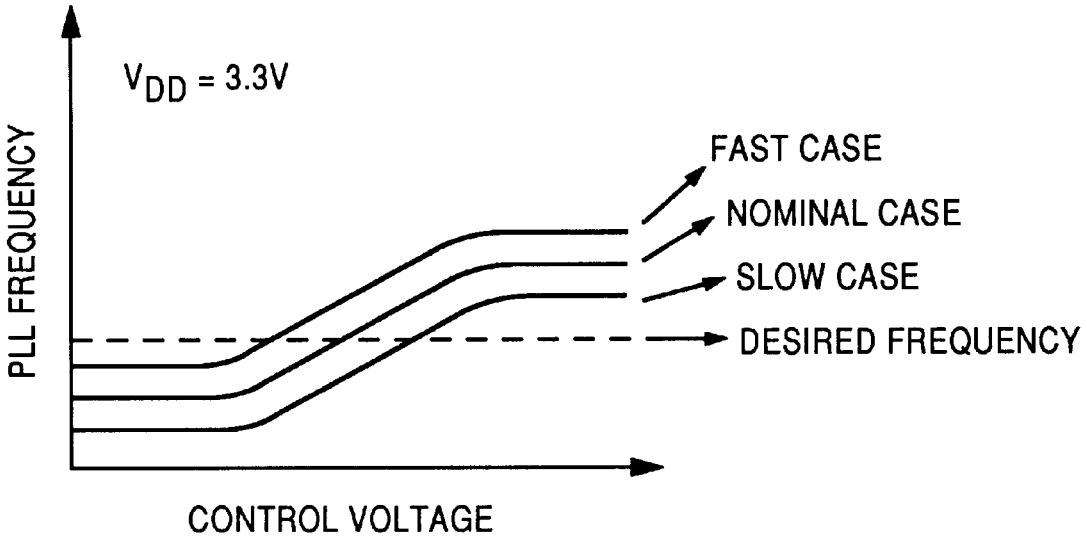
FIGS. 2A and 2B graphically depicts problems encountered when PLL supply voltage changes.
Figure 2B:
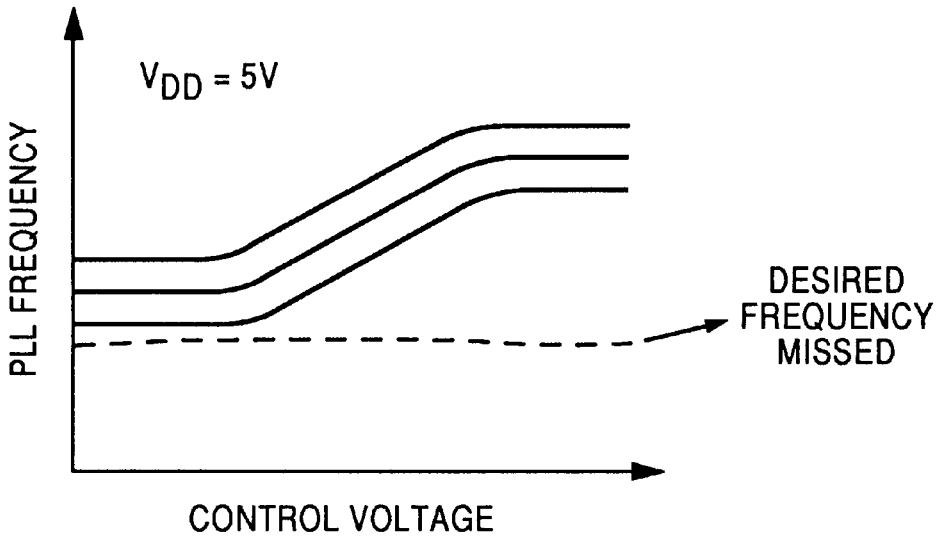

FIG. 3 shows how to adjust the frequency range of a PLL based on supply voltage. First, the power supply voltage level is detected by detector 12. The detector output 13 is coupled to the PLL 14. Supply voltage detector 12 operates by comparing the supply voltage VDD with a reference voltage VREF which is independent of the supply voltage. The reference voltage VREF can come from an external voltage regulator or be generated on-chip by a bandgap reference voltage source. Since the reference voltage VREF will generally be lower than the supply voltage VDD, the reference voltage cannot be compared directly with the supply voltage. Rather, the supply voltage is scaled and compared with the reference voltage. There are many possible ways to scale down the supply voltage. One way is to use a voltage divider as shown in FIG. 4. If all that is needed is to operate the PLL at 3.3 V and 5 V, a divide-by-two voltage divider R1/R2 is used to scale the supply voltage VDD from 3.3 V to 1.65 V and from 5 V to 2.5 V. For an equal margin on both sides, a 2.075 V reference voltage VREF is used to detect the supply voltage.

Figure 5:
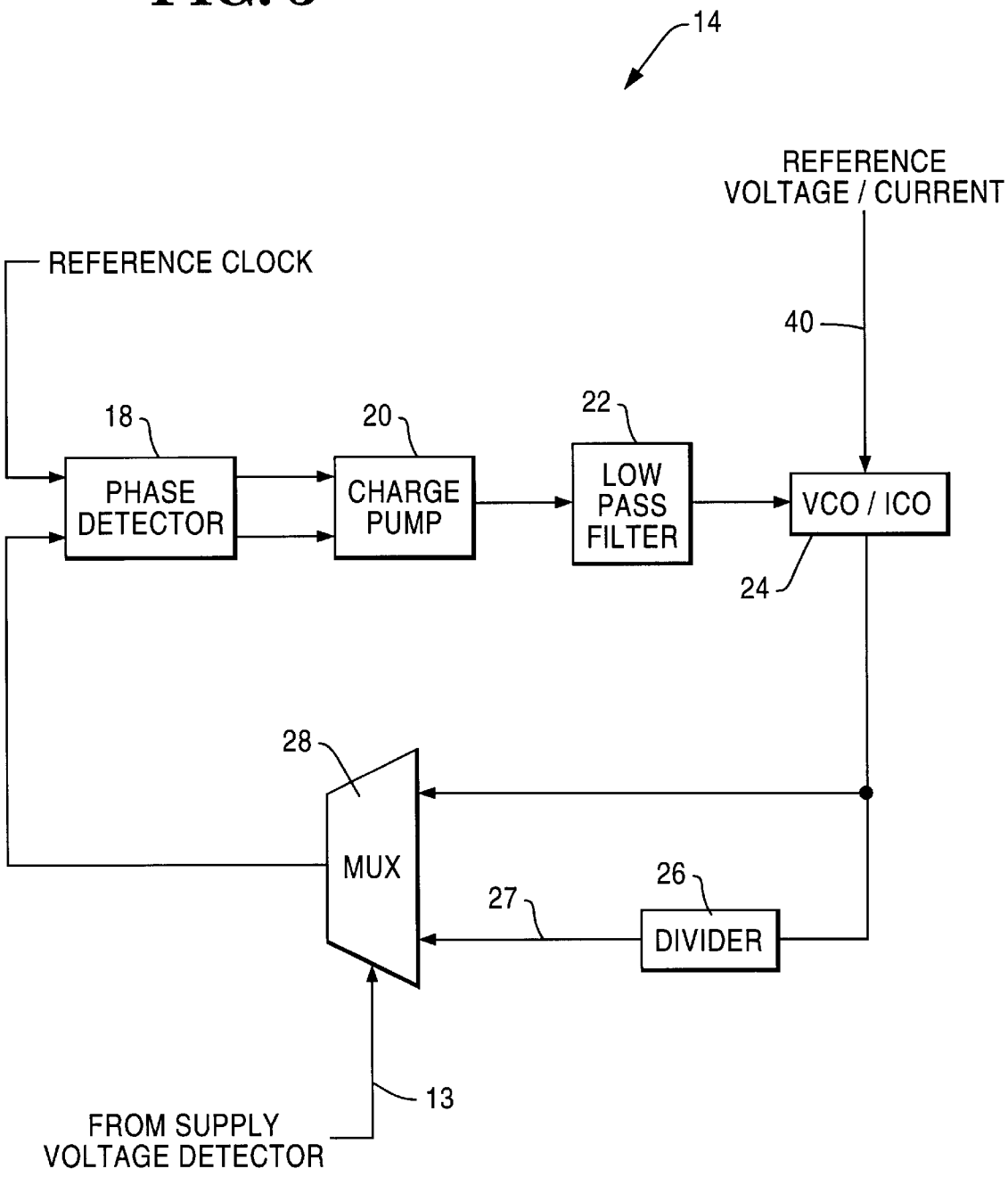
FIG. 5 is a detailed block diagram of an improved phase-locked loop.

Once the supply voltage level is detected, the next step is to find a way to adjust the PLL frequency range accordingly. A possible solution is to insert a frequency divider which can be enabled when operated at 5 V to divide down the PLL output frequency. FIG. 5 shows a phase-locked loop 14 comprising a phase detector 18, charge pump 20, low pass filter 22 and VCO/ICO 24. However, as also shown in FIG. 5, the PLL has been modified to include a frequency divider 26 between the VCO/ICO 24 and the phase detector 18. The output 27 from the frequency divider 26 is selected by the multiplexer 28 if a 5 V supply voltage is detected, as indicated by control line 13 (which may be generated by the circuit shown in FIG. 4).

However, there are a few drawbacks associated with this approach. First of all, the frequency divider 26 requires extra silicon area and consumes extra power at relatively high frequency. Secondly, if a non-integer divider is required, it could be difficult to implement. An easier way to adjust the PLL frequency range is to adjust the reference voltage or current 40 that goes into the PLL. Most of the VCO (Voltage-Controlled Oscillator) or ICO (Current-Controlled Oscillator) based PLLs have either an external voltage or current source that determines the PLL's center operating frequency, one such oscillator being described in U.S. Pat. No. 5,302,920 entitled "Controllable Multi-Phase Ring Oscillators with Variable Current Sources and Capacitances", which is hereby incorporated by reference. By changing the reference voltage or current 40, the PLL frequency range can be adjusted based on the detected supply voltage.

Figure 6:
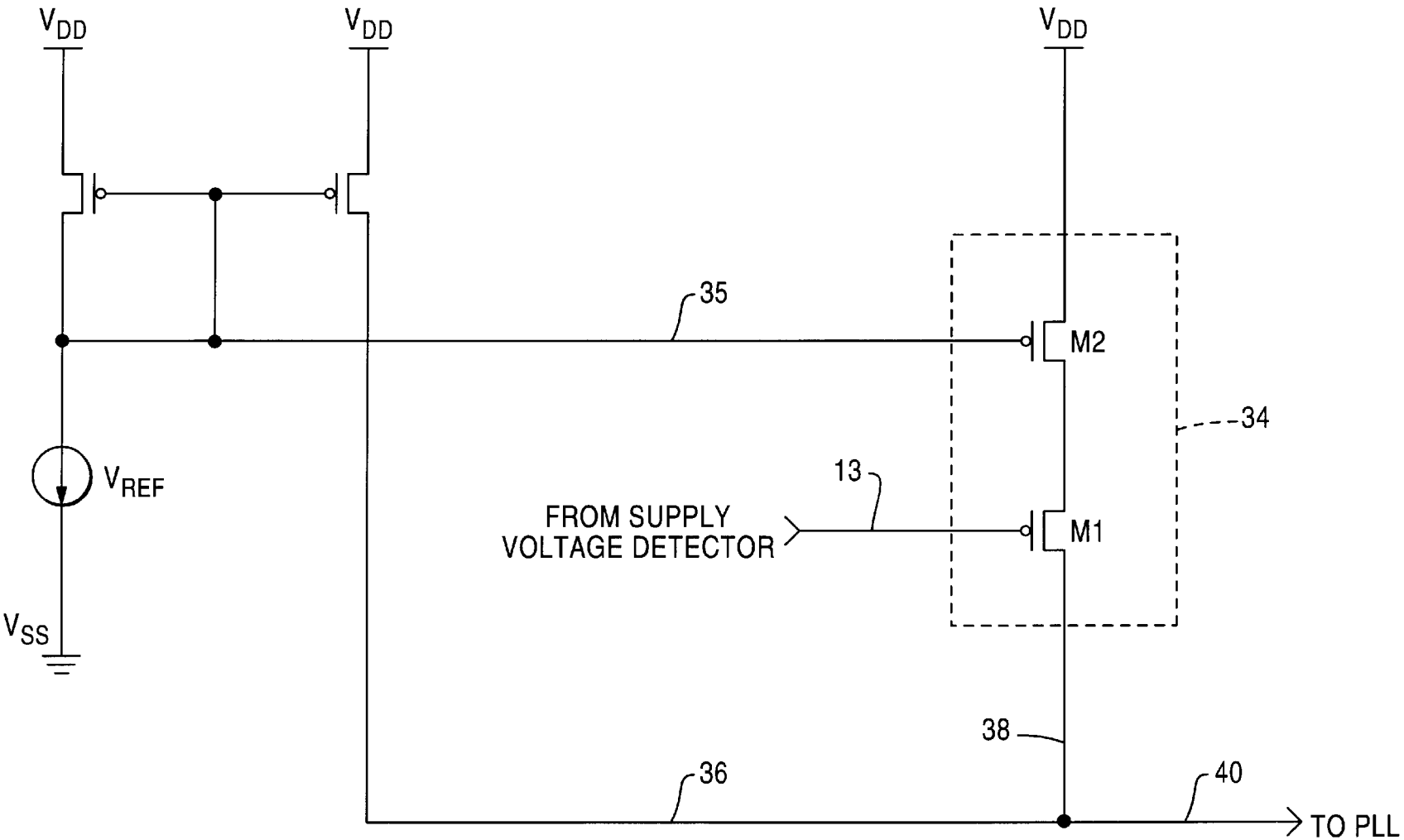
FIG. 6 is a schematic for changing the reference voltage/current of a PLL using a voltage to current converter.

FIG. 6 gives an example on how this can be done by adding two transistors M1 and M2, which function as a voltage to current (V-I) converter 34. The reference current going into the PLL at 40, which is the sum of current source output 36 and V-I converter output 38, is reduced by turning off the transistor M1 when a 5V power supply voltage is detected, as indicated by control line 13. If a 3.3 V power supply voltage is detected, transistor M1 is turned on, and supplies additional current to the PLL via output 38 to PLL input 40.

Figure 7:
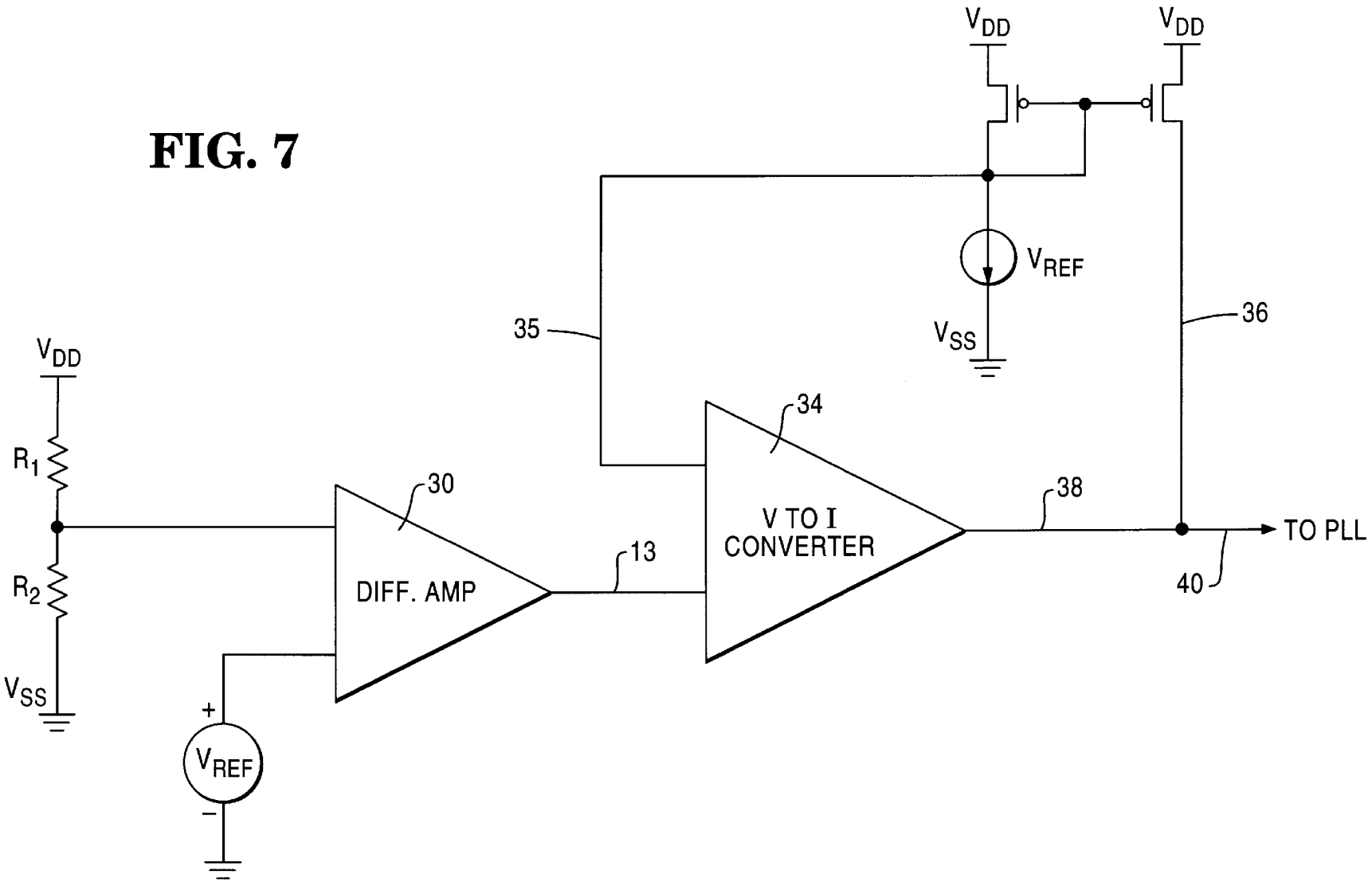
FIG. 7 is a schematic for changing the reference voltage/current of a PLL using a voltage to current converter, and including supply voltage detection circuitry.

FIG. 7 shows how to operate the PLL at both 3.3 V and 5 V. It is even better if the frequency range could be adjusted linearly with the supply voltage so that the PLL could operate at any supply voltage level. This is done by replacing the comparator 16 of FIG. 4 with a differential amplifier, as shown at 30 in FIG. 8. The output 52 of the differential amplifier is proportional to the difference between the supply-independent reference voltage VREF and the scaled supply voltage VDD. This output voltage 52 is then used to adjust the reference voltage/current going into the PLL, similar to the technique that was previously described with respect to FIG. 6. However, since the differential amplifier provides an analog output voltage (as opposed to a digital output from the comparator of FIG. 7), a simplified voltage to current converter 44 is used.

Figure 9:
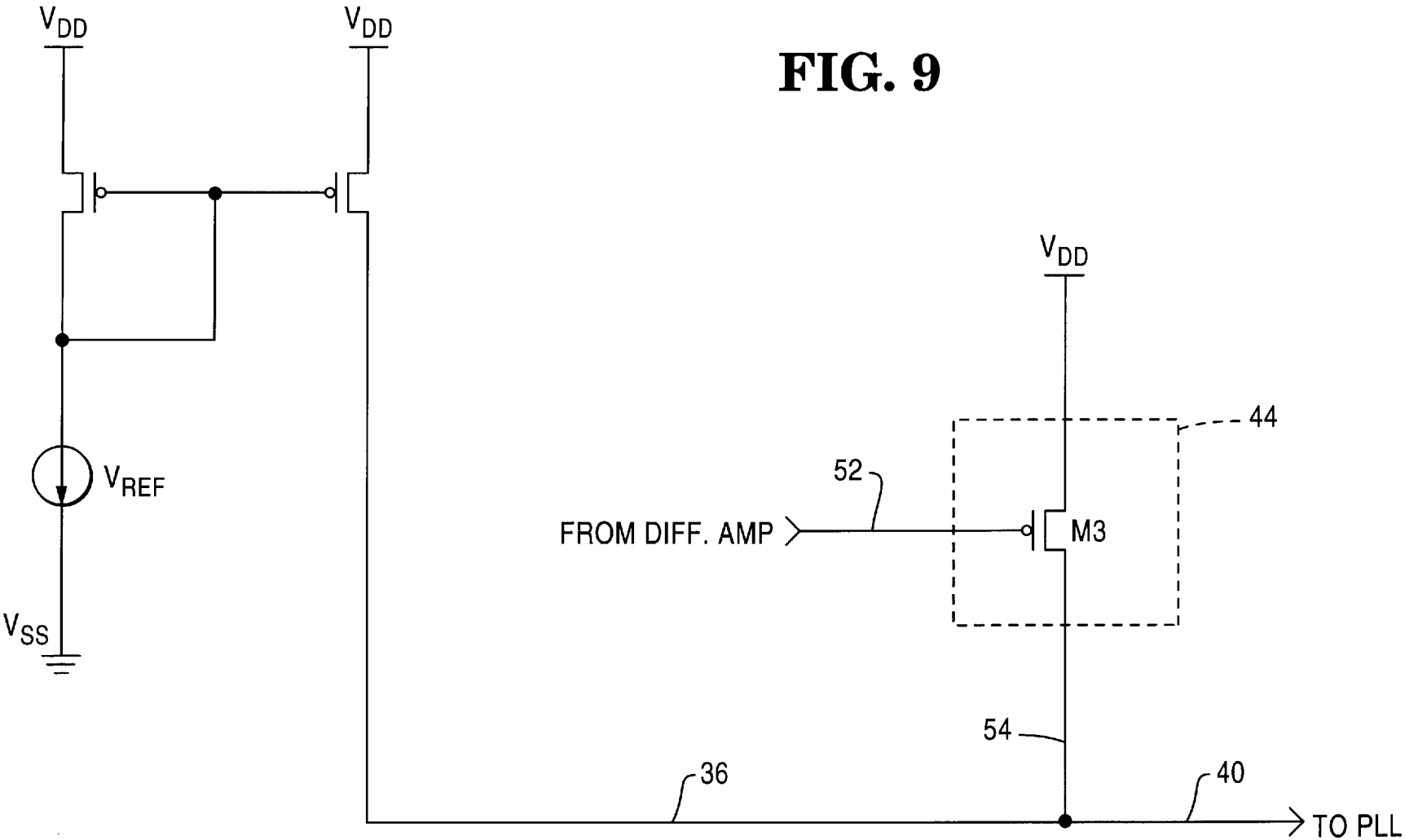
FIG. 9 is a schematic for changing the reference voltage/current of a PLL using a linear current source.

As shown in FIG. 9, the simplified voltage to current converter only requires a single transistor M3, which is biased by the output voltage 52 from the differential amplifier 30.

Figure 8:
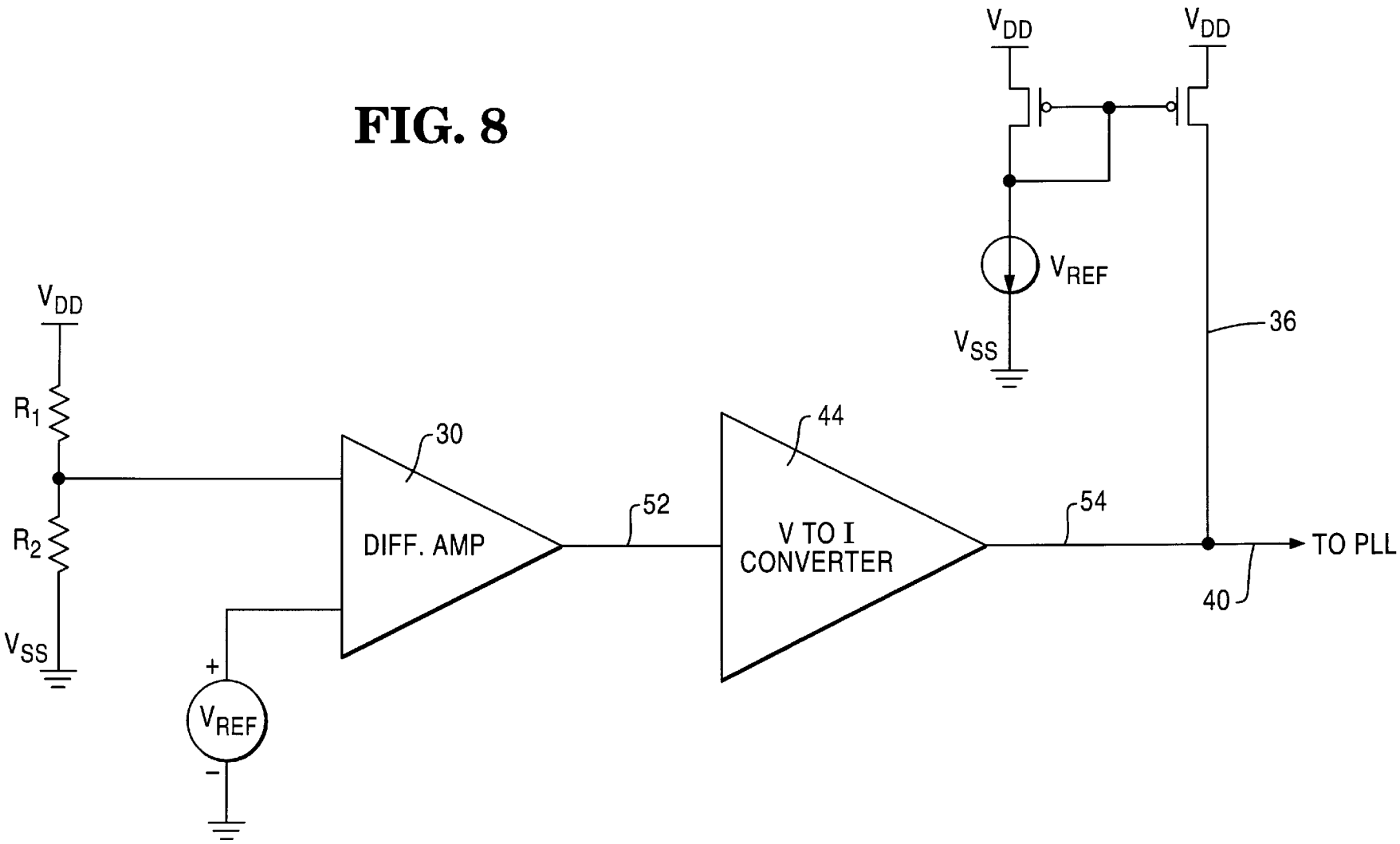
FIG. 8 is a schematic for changing the reference voltage/current of a PLL using a linear current source, and including supply voltage detection circuitry.

The circuit of FIG. 8 thus provides a technique for adjusting the reference current linearly with the supply voltage, such that the PLL can operate at a plurality of dissimilar supply voltages.

While I have illustrated and described the preferred embodiments of our invention, it is to be understood that I do not limit myself to the precise constructions herein disclosed, and the right is reserved to all changes and modifications coming within the scope of the invention as defined in the appended claims.

I claim:

[1. A method for operating a phase-locked loop, comprising the steps of:

detecting a supply voltage; and adjusting the operating frequency of the phase-locked loop based upon the detected supply voltage.]

2. A method to adjust the frequency range of a phase-locked loop, comprising the steps of:

detecting a supply voltage; and enabling or disabling one or more frequency dividers in the PLL based upon the detected supply voltage.

[3. A method to adjust the frequency range of a phase-locked loop (PLL), comprising the steps of:

detecting a supply voltage; and adjusting a PLL reference voltage or current based upon the detected supply voltage.]

[4. A phase-locked loop, comprising:

means for detecting a supply voltage; and means for adjusting the operating frequency of the phase-locked loop based upon the detected supply voltage.]

5. A system for adjusting the frequency range of a phase-locked loop, comprising:

means for detecting a supply voltage; and means for selectively enabling at least one frequency divider in the PLL based upon the detected supply voltage.

[6. A system for adjusting the frequency range of a phase-locked loop (PLL), comprising:

means for detecting a supply voltage; and means for adjusting a PLL reference voltage or current based upon the detected supply voltage.]

[7. A phase-locked loop circuit powered by a supply voltage, comprising:

at least one current source which adjusts the reference operating point of an oscillator in said phase-locked loop based upon the supply voltage.]

[8. A phase-locked loop circuit powered by a supply voltage, comprising:

a phase detector operatively coupled to a charge pump;

a filter operatively coupled to the charge pump;

an oscillator, operatively coupled to the filter, said oscillator having a reference operating point; and adjusting means for dynamically adjusting the reference operating point based upon the supply voltage.]

[9. The circuit of claim 8 wherein the adjusting means comprises a plurality of current sources.]

[10. The circuit of claim 9 further comprising means for selectively enabling at least one of the plurality of current sources.]

11. A circuit for adjusting the [reference operating point] *frequency range* of a phase-locked loop, comprising:

a differential amplifier having a reference voltage input and a scaled supply voltage input*, said differential amplifier generating an output that is proportional to a difference between said reference voltage input and said scaled supply voltage input*;

a linear current source having at least one input coupled to [an] *said* output of [the] *said* differential amplifier*, said linear current source providing a current output related to said output of said differential amplifier*; and a fixed current source coupled to an output of the linear current source*, said fixed current source generating an output and, together with said current output of said linear current source, being used to adjust a signal applied to the phase-locked loop*.

[12. A phase-locked loop circuit powered by a supply voltage, comprising:

a phase detector operatively coupled to a charge pump;

a filter operatively coupled to the charge pump;

an oscillator, operatively coupled to the filter, said oscillator having a reference operating point; and at least one current source which adjusts the reference operating point of said oscillator based upon the supply voltage.]

*13. A circuit of claim 11 wherein said scaled supply voltage input is provided using a supply voltage and said reference voltage input is provided independently of said supply voltage.*

* * * * *